United States Patent
Tanuma et al.

(10) Patent No.: US 10,367,053 B2
(45) Date of Patent: Jul. 30, 2019

(54) APPARATUSES AND METHODS FOR SEMICONDUCTOR CIRCUIT LAYOUT

(71) Applicant: Micron Technology, Inc., Boise, ID (US)

(72) Inventors: Yasuhiko Tanuma, Tokyo (JP); Takashi Ishihara, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/896,491

(22) Filed: Feb. 14, 2018

(65) Prior Publication Data
US 2018/0175017 A1 Jun. 21, 2018

Related U.S. Application Data

(63) Continuation of application No. 15/063,117, filed on Mar. 7, 2016, now Pat. No. 9,929,135.

(51) Int. Cl.
*H01L 49/02* (2006.01)
*H01L 27/02* (2006.01)
*H01L 27/06* (2006.01)
*G06F 17/50* (2006.01)
*H01L 29/73* (2006.01)
*H01L 27/118* (2006.01)

(52) U.S. Cl.
CPC .......... *H01L 28/20* (2013.01); *G06F 17/5072* (2013.01); *H01L 27/0207* (2013.01); *H01L 27/0288* (2013.01); *H01L 27/0629* (2013.01); *H01L 27/11807* (2013.01); *H01L 28/00* (2013.01); *H01L 29/7304* (2013.01)

(58) Field of Classification Search
CPC ............ H01L 27/0288; H01L 27/0629; H01L 27/0647; H01L 27/0652; H01L 28/00; H01L 28/20; H01L 29/7304; H01L 31/16; H01L 27/118; H01L 27/11803
See application file for complete search history.

(56) References Cited

U.S. PATENT DOCUMENTS

| 9,929,135 B2* | 3/2018 | Tanuma ............... H01L 27/0207 |
| 2002/0153585 A1* | 10/2002 | Asano .................. H01L 21/4832 257/472 |
| 2005/0133864 A1* | 6/2005 | Iwamatsu ......... H01L 21/76283 257/347 |
| 2009/0091027 A1 | 4/2009 | Fan |
| 2012/0175708 A1* | 7/2012 | Schuetz .......... H01L 21/823892 257/369 |

(Continued)

*Primary Examiner* — Eduardo A Rodela
(74) *Attorney, Agent, or Firm* — Dorsey & Whitney LLP

(57) ABSTRACT

Apparatuses including circuit layout regions of a semiconductor device and methods of designing the circuit layout regions of a semiconductor device are described. An example apparatus includes a first layout region including a first transistor area including at least one first transistor, at least one contact in proximity to the first transistor area, and a first resistor area comprising at least one first resistor coupled to the at least one first transistor. The first transistor area and the at least one contact are aligned in a first direction, and the first transistor area and the first resistor area are aligned in a second direction. The second direction may be substantially perpendicular to the first direction. The at least one contact may be one of a substrate contact and a well contact.

19 Claims, 10 Drawing Sheets

(56) References Cited

U.S. PATENT DOCUMENTS

2014/0306296 A1\* 10/2014 Jeon .................... H01L 27/1104
                                                              257/401
2016/0211860 A1\* 7/2016 Isozaki .................. H03M 1/66
2017/0256529 A1    9/2017 Tanuma et al.
2017/0301665 A1\* 10/2017 Nakanishi ........... G06F 17/5072

\* cited by examiner

APPARATUSES AND METHODS FOR SEMICONDUCTOR CIRCUIT LAYOUT

CROSS REFERENCE TO RELATED APPLICATION(S)

This application is a continuation of U.S. patent application Ser. No. 15/063,117 filed Mar. 7, 2016 and issued as U.S. Pat. No. 9,929,135 on Mar. 27, 2018. The aforementioned application, and issued patent, is incorporated herein by reference in its entirety, for any purpose.

BACKGROUND

High data reliability, high speed of memory access, and reduced chip size are features that are demanded from semiconductor memory.

In recent years, there has been an effort to reduce a chip size for semiconductor devices. As part of that effort to reduce the chip size, reduction of a logic circuit area through layout optimization has been playing an important role as well as area reduction through improved microfabrication processes.

Generally, a layout of the area for logic circuits includes one or more standard cells. A standard cell is a small-scale circuit unit including a group of at least one transistor and interconnect structures with a standardized constant width. The standard cell may provide a logic function or a storage function. Typically, the standard cell provides a substrate contact (sub-contact) for an n-channel transistor and a well-contact for a p-channel transistor within the standard cell in order to supply the transistor in the standard cell with a stable bulk voltage. Because standard cells arrangement allows various combinations of standard cell types next to each other in the area for logic circuits, standard cells are designed to provide the sub-contact and well-contact without fail regardless of adjacent standard cell type combinations.

A delay circuit includes a capacitance and a resistance on a signal line and provides a delay. Typically, a delay circuit that may be provided as a standard cell includes an inverter, a resistance element, and a capacitive element. The delay circuit occupies a relatively large area for at least two reasons. First, space tends to be created in an area adjacent to the resistance element or an area adjacent to the transistor due to a difference in area between the resistance element and the transistor. Second, the resistance element may be surrounded by any sub-contact or well-contact included in the standard cell. Thus, reducing the space as well as the number of sub-contacts and well-contacts adjacent to the resistance element may be desired for the area reduction of the delay circuit.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
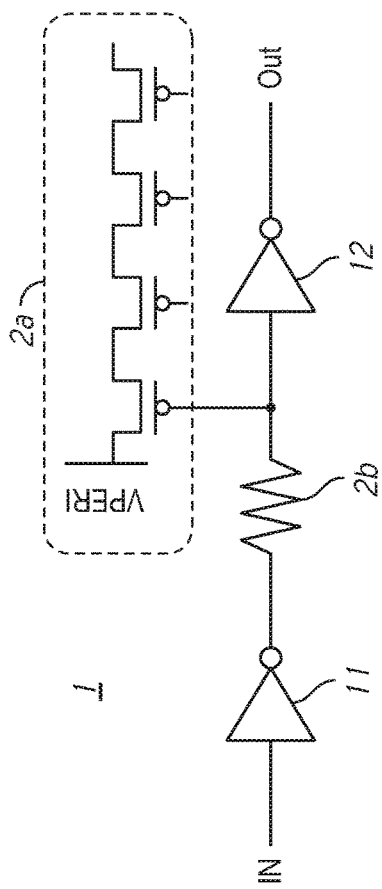
FIG. 1A is a circuit diagram of an example of a delay circuit.
Figure 1B:
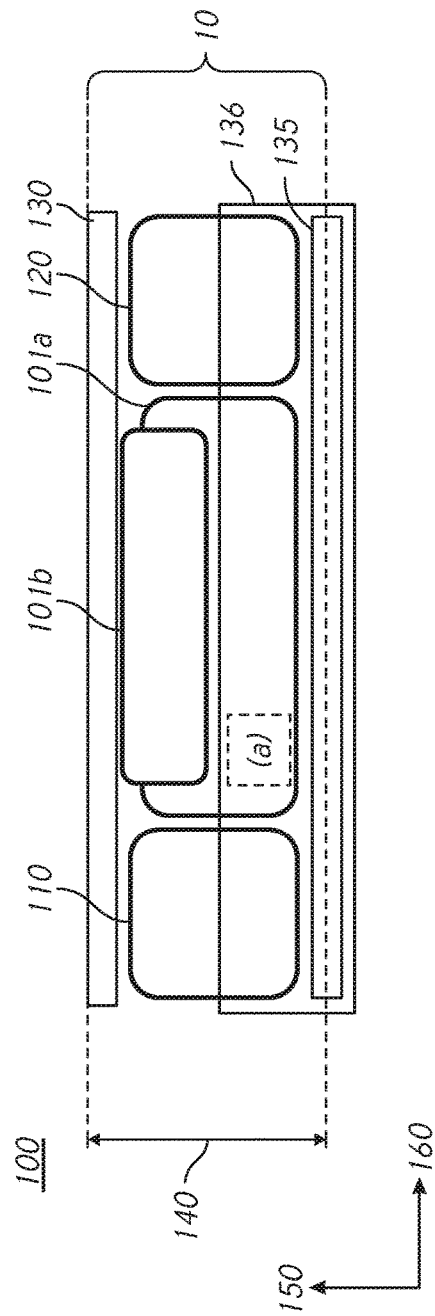
FIG. 1B is a simplified layout diagram of the example of the delay circuit including standard cells.

FIG. 1A is a circuit diagram of an example of a delay circuit 1. The delay circuit 1 includes inverters 11 and 12, a plurality of transistors 2a which functions as a capacitor and a resistor 2b. FIG. 1B is a simplified layout diagram of the example of the delay circuit including standard cells. The delay circuit 100 may be used as the delay circuit 1 in FIG. 1A, which is fabricated on a substrate that has a first conductivity type. A substrate contact (sub-contact) area 130 is of the first conductivity type. A substrate voltage is applied to the substrate through the sub-contact area 130. A well region 136, disposed in the substrate, is of a second conductivity type that is different from the first conductivity type. A well-contact area 135 is of the second conductivity type. A well voltage is applied to the well region 136 through the well-contact area 135. A layout region 10 with a first width 140 in a first direction 150 extends in a second direction 160. The layout region 10 includes the sub-contact area 130 and the well-contact area 135. The delay circuit 100 includes at least one logic circuit in a transistor area 101a and a resistive element in a resistor area 101b. For example, the transistor area 101a may correspond with the plurality of transistors 2a in FIG. 1A and the resistive element in the resistor area 101b may correspond with the resistor 2b in FIG. 1A. The logic circuit is electrically coupled to the resistive element. The sub-contact area 130 is a contact area that may have a line-shaped active area extending in the second direction 160. The active area is a diffusion layer that has high concentration of an impurity for the same conductivity type as the substrate (it may be a well-region that has the same conductivity type as the substrate). The well-contact area 135 is a contact area that may have a line-shaped active area extending in the second direction 160. The active area is a diffusion layer that has high concentration of impurity for the same conductivity type as the well region 136 (e.g., an N-well region). The width 140 of the layout region 10 is defined by the sub-contact area 130 and the well-contact area 135 in the first direction 150. Each of the well-contact area 135 and the sub-contact area 130 may be shared with one of adjacent layout regions of the layout region 10. The well region 136 may extend over the layout region 10 and may also be shared with one of adjacent layout regions of the layout region 10. Thus, the well-contact area 135 disposed in the well region 136 may be shared with one of adjacent layout regions of the layout region 10. Standard cells 110 and 120 as peripheral circuit blocks are arranged within the layout region 10. For example, the standard cells 110 and 120 that may be inverters 11 and 12 of FIG. 1A are aligned to each other between the sub-contact area 130 and the well-contact area 135 along the second direction 160. The resistor area 101*b* may be defined in the width 140 in the first direction 150. The resistor area 101*b* may be located on a side of the 101*a* that is opposite of the side of 101*a* that is nearer the well-contact area 135.

Figure 2:
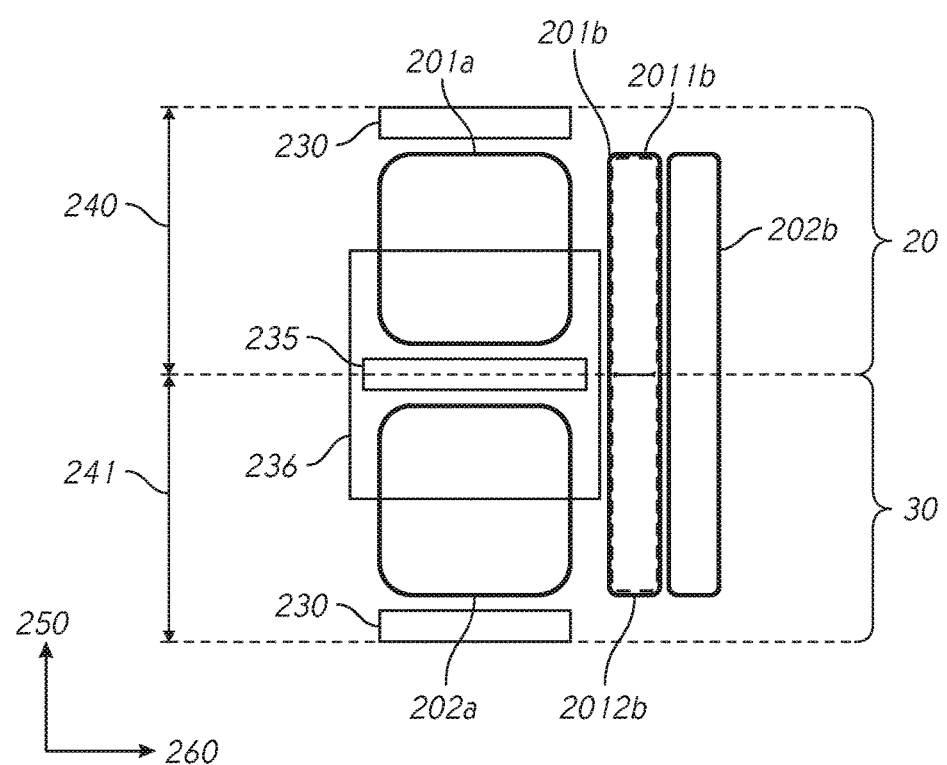
FIG. 2 is a simplified layout diagram of logic circuits in accordance with an embodiment of the present disclosure.

FIG. 2 is a simplified layout diagram of logic circuits in accordance with an embodiment of the present disclosure. A first layout region 20 and a second layout region 30 may be circuit layout regions that are adjacent to each other in a first direction 250. The first layout region 20 and the second layout region 30 extend in a second direction 260 with a first width 240 and a second width 241, respectively. The second direction 260 may be substantially perpendicular to the first direction 250. In this example, the first layout region 20 and the second layout region 30 share a well-contact area 235 on a side shared by the first layout region 20 and the second layout region 30. In this manner, the well-contact area 235 extending in the second direction 260 may be shared by two adjacent layout regions. A well region 236 extends across a portion of the first layout region 20 and across a portion of the second layout region 30. Each of the first layout region 20 and the second layout region 30 includes a sub-contact area 230 extending in the second direction on sides opposite the side shared by the first layout region 20 and the second layout region 30. A first transistor area 201*a* is in the first layout region 20 and a second transistor area 202*a* is in the second layout region 30. The transistor areas 201*a* and 202*a* and the well-contact area 235 are adjacent to each other in an area defined by the sub-contact area 230 and the well-contact area 235 along the first direction 250 in a manner that the well-contact area 235 is located between the transistor areas 201*a* and 202*a* and is shared by the transistor areas 201*a* and 202*a*. A first logic circuit in the transistor area 201*a* is electrically coupled to a first resistive element in a first resistor area 201*b*. A second logic circuit in the second transistor area 202*a* is electrically coupled to a second resistive element in a second resistor area 202*b*. In this example, the first resistor area 201*b* and the second resistor area 202*b* are aligned to each other along the second direction 260 and extend across a portion of the first layout region 20 and a portion of the second layout region 30 in the first direction 250. In this example, the resistor area includes a first portion 2011*b* and a second portion 2012*b* and includes the first resistive element that extends continuously from the first portion 2011*b* to the second portion 2012*b* in the first direction 250. The first portion 2011*b* and the second portion 2012*b* are adjacent respectively to the first transistor area 201*a* and the second transistor area 202*a* along the second direction 260 that is substantially perpendicular to the first direction 250. In this example, the first resistor area 201*b* and the second resistor area 202*b* are disposed in an adjacent area outside of an area defined by the sub-contact area 230 and the well-contact area 235, because the second direction 260 is substantially perpendicular to the first direction 250. In some embodiments, the first transistor area 201*a* may include a plurality of transistors. The plurality of transistors may be configured as the first logic circuit. Similarly, the second transistor area may include a plurality of transistors. The plurality of transistors may be configured as the second logic circuit. In one embodiment, the first transistor area 201*a* may be a first complementary metal-oxide semiconductor (CMOS) area including a plurality of first channel type transistors (e.g., n-channel transistors). The second transistor area 202*a* may be a second CMOS area including a plurality of second channel type transistors (e.g., p-channel transistors) shown as the plurality of transistors 2*a* in FIG. 1A. However, alternative transistor areas may be assigned to these channel types.

Figure 3A:
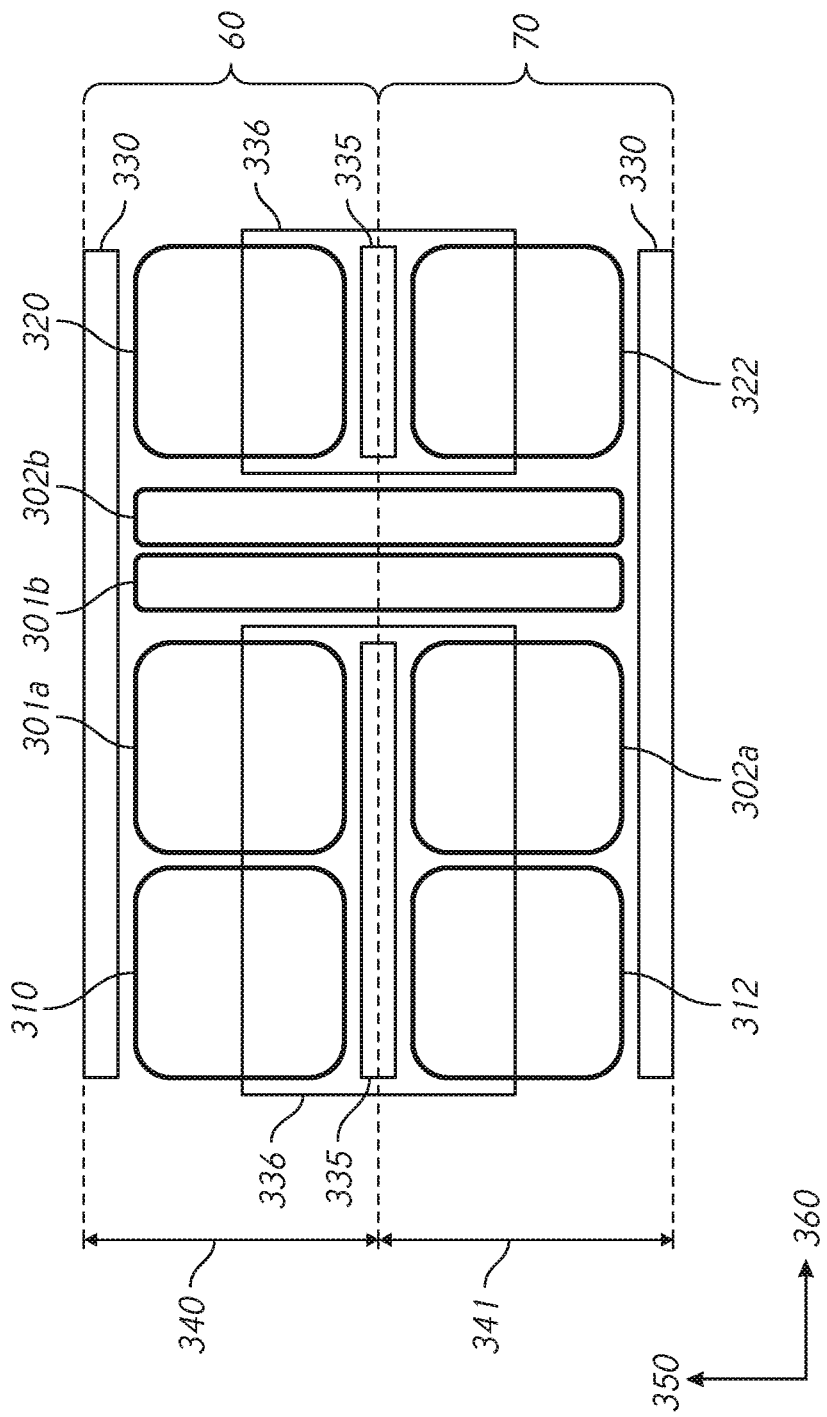
FIGS. 3A-3E are simplified layout diagrams of logic circuits including circuit cells in accordance with an embodiment of the present disclosure.

FIG. 3A is a simplified layout diagram of logic circuits including circuit cells in accordance with an embodiment of the present disclosure. A first layout region 60 and a second layout region 70 are adjacent to each other in a first direction 350. The first layout region 60 and the second layout region 70 extend in a second direction 360 with a first width 340 and a second width 341, respectively. The second direction 360 may be substantially perpendicular to the first direction 350. In this example, the first layout region 60 and the second layout region 70 share a well-contact area 335 on a side shared by the first layout region 60 and the second layout region 70. In this manner, the well-contact area 335 may be shared by two adjacent layout regions. A well region 336 extends across a portion of the first layout region 60 and across a portion of the second layout region 70. Each of the first layout region 60 and the second layout region 70 includes a sub-contact area 330 at sides opposite the side shared by the first layout region 60 and the second layout region 70. A first transistor area 301*a* and peripheral circuit blocks in circuit cells 310 and 320 are in the first layout region 60. A transistor area 302*a* and peripheral circuit blocks in circuit cells 312 and 322 are in the second layout region 70. The transistor areas 301*a* and 302*a* are disposed in the first and the second layout regions 60 and 70, respectively, along the first direction 350 across the well-contact area 335 in order to share the well-contact area 335. A first delay circuit includes a first logic circuit in the first transistor area 301*a* and a first resistive element in a first resistor area 301*b*. The first logic circuit is electrically coupled to the first resistive element. A second delay circuit includes a second logic circuit disposed in the second transistor area 302*a* and a second resistive element in a second resistor area 302*b*. The second logic circuit is electrically coupled to the second resistive element. In one embodiment, the first delay circuit and the second delay circuit may be the delay circuit 1 of FIG. 1A. In this example, the first resistor area 301*b* and the second resistor area 302*b*, being adjacent to each other and aligned to each other along the second direction 360, extend across the first layout region 60 to the second layout region 70 in the first direction 350. In this example, the first resistor area 301*b* and the second resistor area 302*b* are disposed outside of an area defined by the sub-contact area 330 and the well-contact area 335.

Figure 3B:
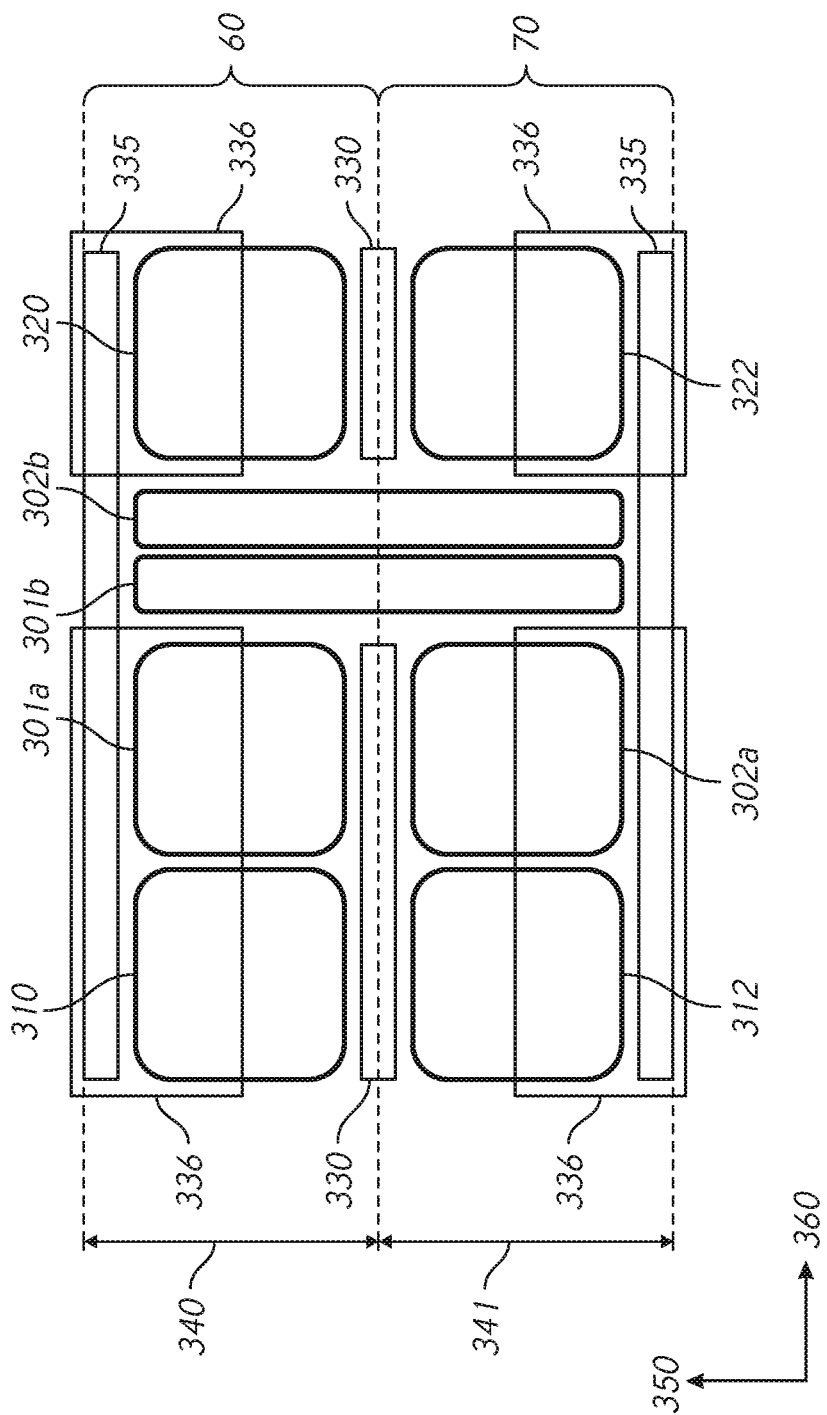

FIG. 3B is a simplified layout diagram of logic circuits including circuit cells in accordance with an embodiment of the present disclosure. Description of components corresponding to components included in FIG. 3A will not be repeated and changes from FIG. 3A including positional relationships between the components will be described. In this example, the first layout region 60 and the second layout region 70 share a sub-contact area 330 on a side shared by the first layout region 60 and the second layout region 70. In this manner, the sub-contact area 330 may be shared by two adjacent layout regions. Each of the first layout region 60 and the second layout region 70 includes a well-contact area 335 in a well region 336 at sides opposite the side shared by the first layout region 60 and the second layout region 70. A first transistor area 301*a* and peripheral circuit blocks in circuit cells 310 and 320 are in the first layout region 60. A transistor area 302*a* and peripheral circuit blocks in circuit cells 312 and 322 are in the second layout region 70. The first transistor area 301*a* and the second transistor area 302*a* are disposed in the first and the second layout regions 60 and 70, respectively, along the first direction 350 across the sub-contact area 330 in order to share the sub-contact area 330. A first delay circuit includes a first logic circuit in the first transistor area 301a and a first resistive element in a first resistor area 301b. The first logic circuit is electrically coupled to the first resistive element. A second delay circuit includes a second logic circuit disposed in the second transistor area 302a and a second resistive element in a second resistor area 302b. The second logic circuit is electrically coupled to the second resistive element. In this example, the first resistor area 301b and the second resistor area 302b, aligned to each other along the second direction 360, extend across the first layout region 60 to the second layout region 70 in the first direction 350. In this example, the first resistor area 301b and the second resistor area 302b are disposed outside of an area defined by the sub-contact area 330 and the well-contact area 335.

Figure 3C:
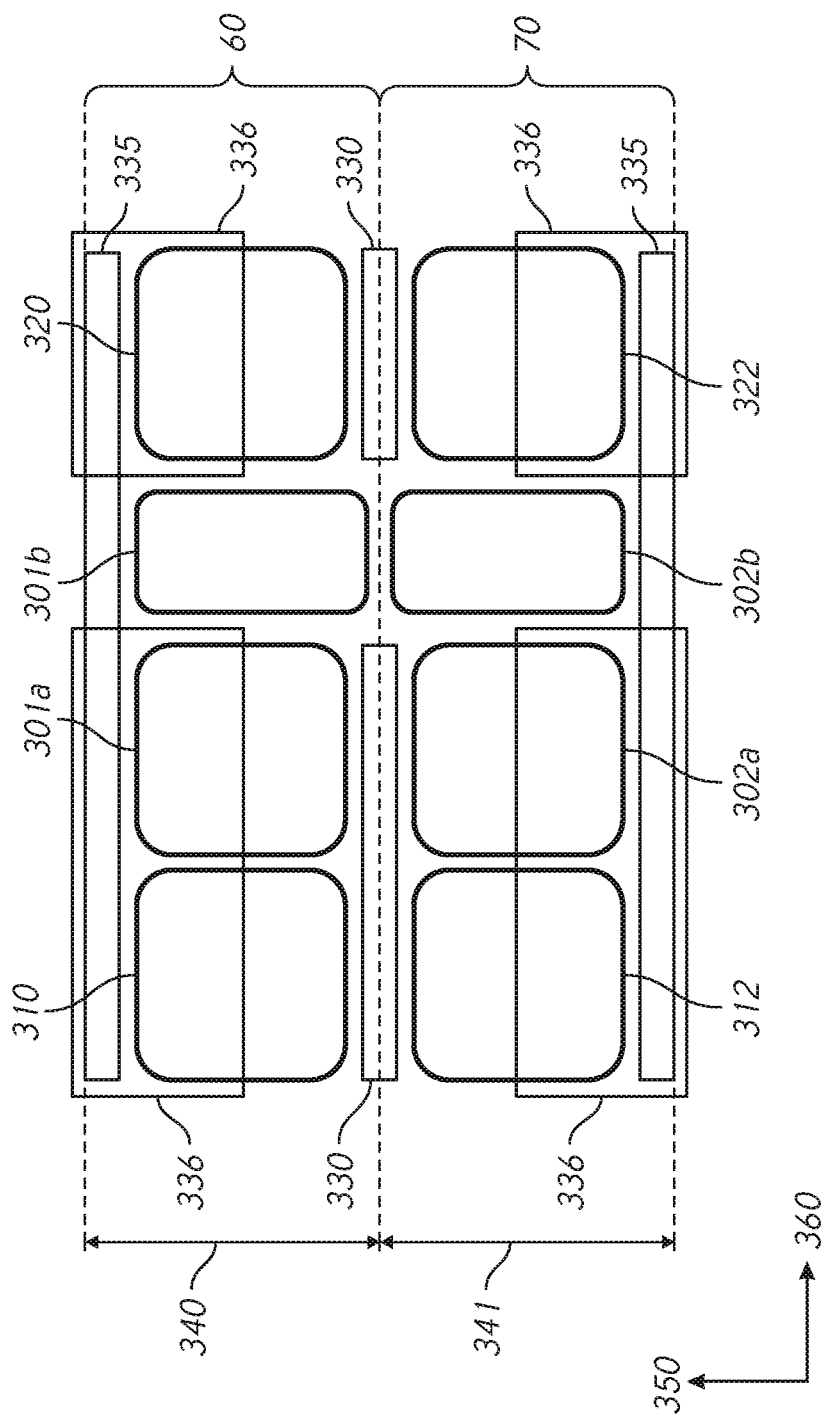

FIG. 3C is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b and the second resistor area 302b, aligned to each other, are disposed in the first layout region 60 to the second layout region 70 in the first direction 350, respectively. The first resistor area 301b and the second resistor area 302b are adjacent to each other disposed outside of an area defined by the sub-contact area 330 and the well-contact area 335.

Figure 3D:
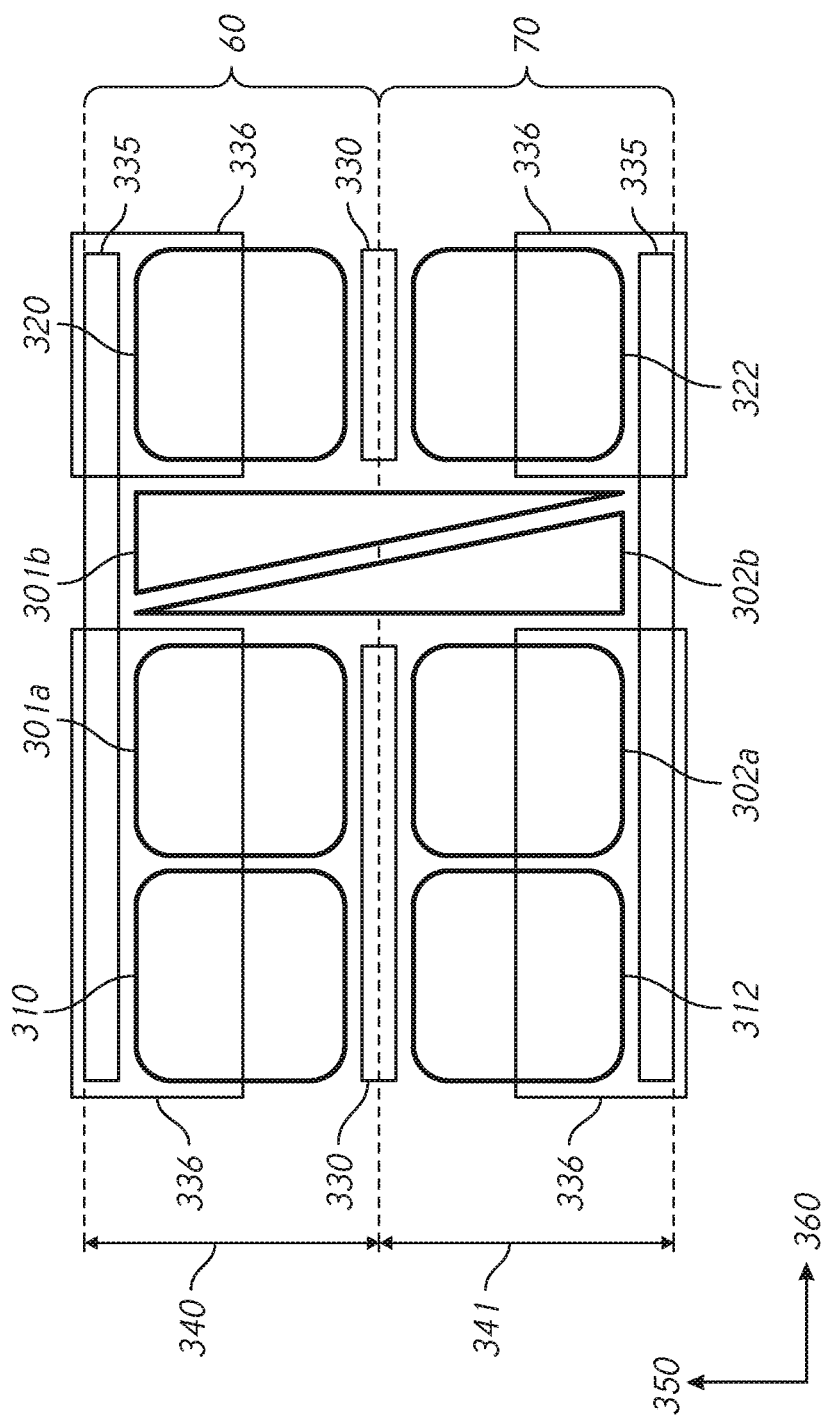

FIG. 3D is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b and the second resistor area 302b both have shapes across the first layout region 60 to the second layout region 70. The first resistor area 301b and the second resistor area 302b are adjacent to each other, disposed outside of an area defined by the sub-contact area 330 and the well-contact area 335.

Figure 3E:
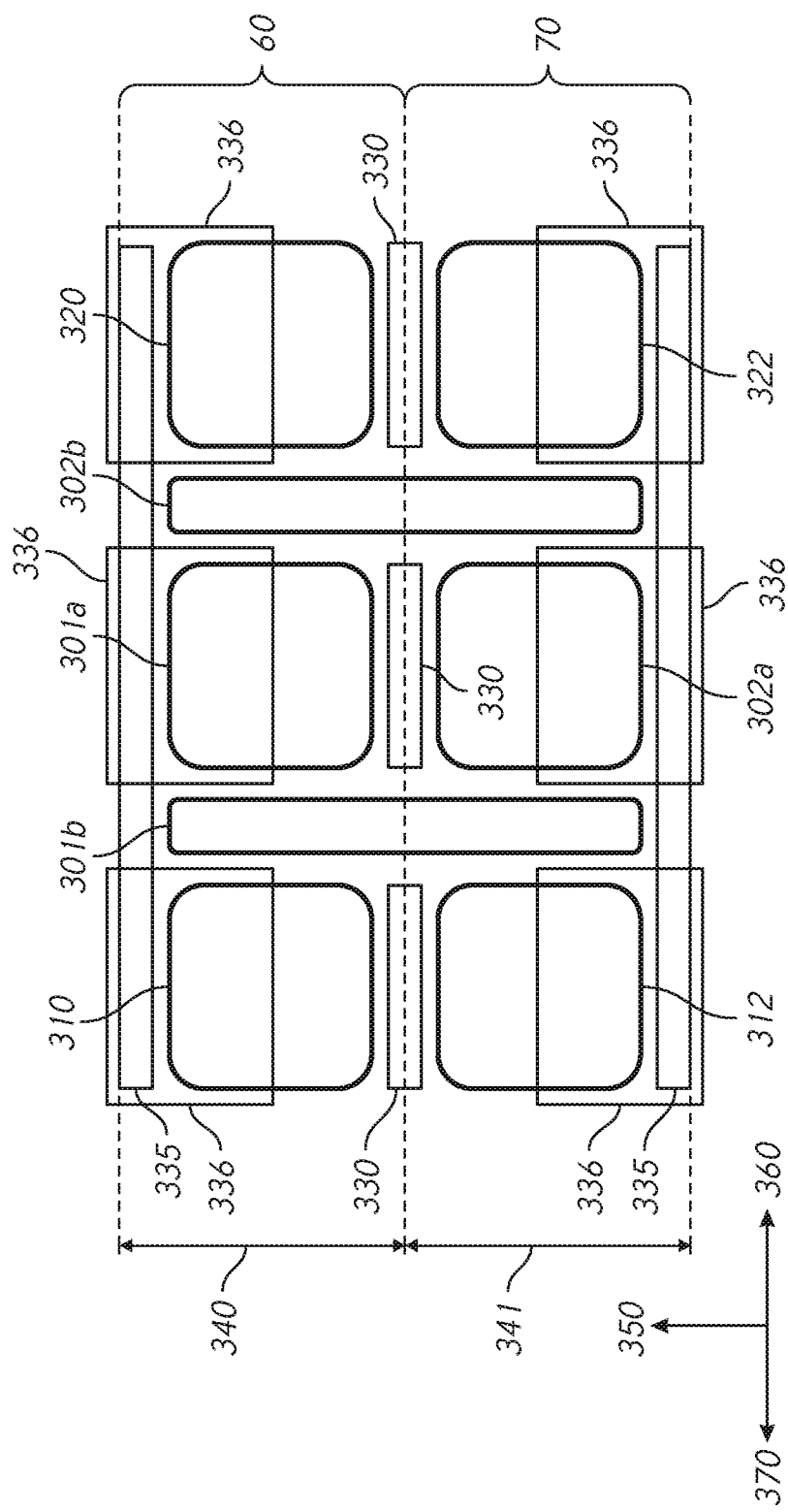

FIG. 3E is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b is disposed adjacent to the first transistor area 301a and the second transistor area 302a along a third direction which is substantially opposite to the second direction 360. The second resistor area 302b is disposed adjacent to the first transistor area 301a and the second transistor area 302a along the second direction 360. The first resistor area 301b and the second resistor area 302b may extend across a portion of the first layout region 60 and across the second layout region 70. In this example, the first resistor area 301b and the second resistor area 302b are disposed outside of an area defined by the sub-contact area 330 and the well-contact area 335.

Figure 4:
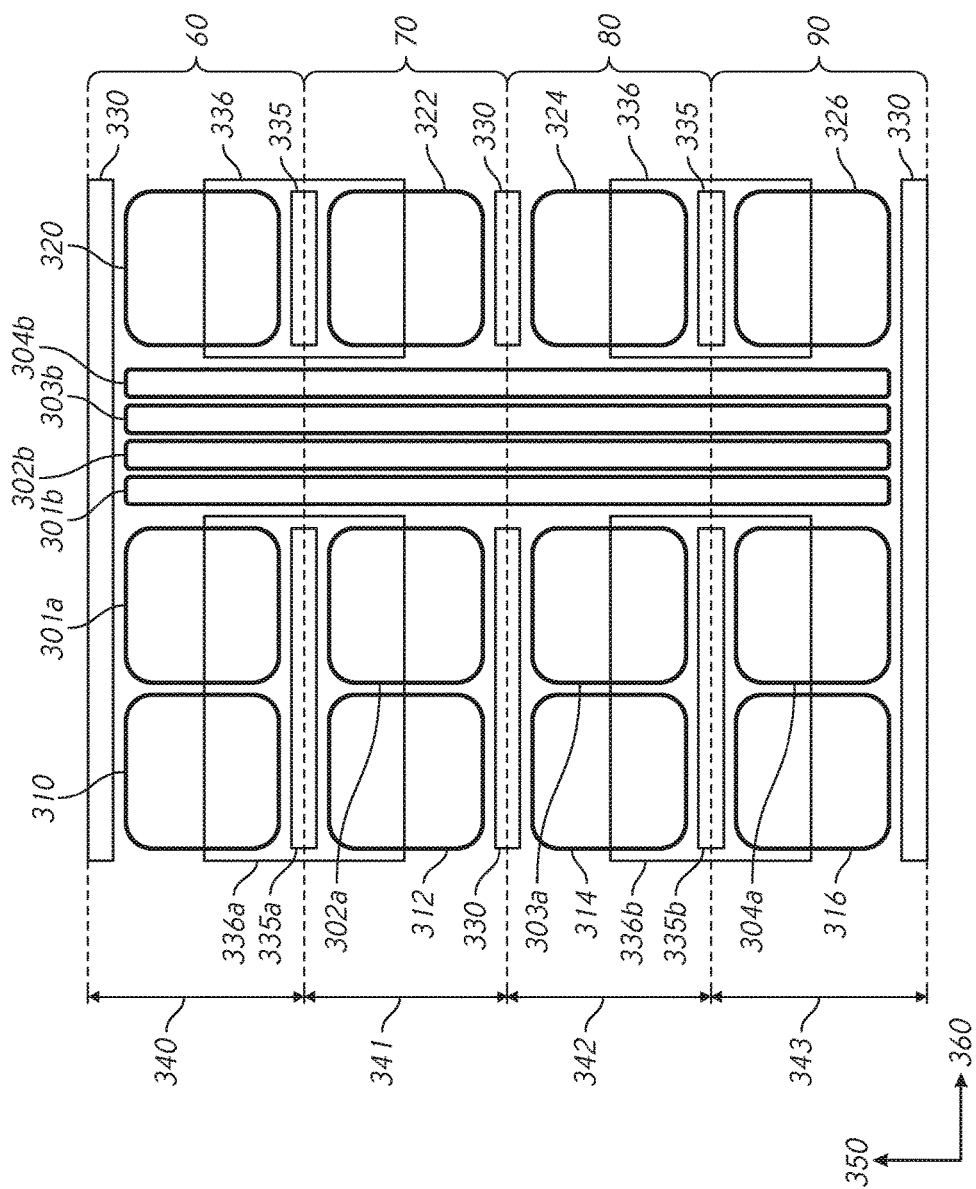
FIG. 4 is a simplified layout diagram of logic circuits including circuit cells in accordance with an embodiment of the present disclosure.

FIG. 4 is a simplified layout diagram of logic circuits including circuit cells in accordance with an embodiment of the present disclosure. For example, a first layout region 60, a second layout region 70, a third layout region 80 and a fourth layout region 90 extend in the second direction 360 with a first width 340, a second width 341, a third width 342 and a fourth width 343 in the first direction 350, respectively.

In this example, the first layout region 60 and the second layout region 70 share one well-contact area 335a in a well region 336a, the third layout region 80 and the fourth layout region 90 share another well-contact area 335b in another well region 336b, and the second layout region 70 and the third layout region 80 share a sub-contact area 330. In this manner, sub-contact areas and well-contact areas may be shared by two adjacent layout regions. The well region 336a extends across a portion of the first layout region 60 and across a portion of the second layout region 70 and the well region 336b extends across a portion of the third layout region 80 and across a portion of the fourth layout region 90. A first transistor area 301a and peripheral circuit blocks in circuit cells 310 and 320 are in the first layout region 60 aligned in the second direction 360. A second transistor area 302a and peripheral circuit blocks in circuit cells 312 and 322 are aligned to each other in the second layout region 70. A transistor area 303a and peripheral circuit blocks in circuit cells 314 and 324 are aligned to each other in the third layout region 80. A fourth transistor area 304a and peripheral circuit blocks in circuit cells 316 and 326 are in the fourth layout region 90 and adjacent to each other along the second direction 360. The transistor areas 301a and 302a are adjacent to each other along the first direction 350 across the well-contact area 335a. The transistor areas 302a and 303a are adjacent to each other along the first direction 350 across the sub-contact area 330. The transistor areas 303a and 304a are adjacent to each other along the first direction 350 across the well-contact area 335b. Thus, sub-contact areas and well-contact areas may be shared by adjacent transistor areas of adjacent layout regions.

A first delay circuit includes a first logic circuit in the first transistor area 301a and a first resistive element in a first resistor area 301b electrically coupled to the first logic circuit. A second delay circuit includes a second logic circuit in the second transistor area 302a and a second resistive element in a second resistor area 302b electrically coupled to the second logic circuit. A third delay circuit includes a third logic circuit in the third transistor area 303a and a third resistive element in a third resistor area 303b electrically coupled to the third logic circuit. A fourth delay circuit includes a fourth logic circuit in the fourth transistor area 304a and a fourth resistive element in a fourth resistor area 304b electrically coupled to the fourth logic circuit. In this example, the first resistor area 301b, the second resistor area 302b, the third resistor area 303b and the fourth resistor area 304b extend across the first layout region 60, the second layout region 70, the third layout region 80 and the fourth layout region 90. The first resistor area 301b, the second resistor area 302b, the third resistor area 303b and the fourth resistor area 304b may be aligned between the sub-contact area 330 in the first layout region 60 and the sub-contact area 330 in the fourth layout region 90 along the second direction 360, The transistor areas 301a, 302a, 303a and 304a in the first layout region 60, the second layout region 70, the third layout region 80 and the fourth layout region 90 respectively, are disposed along the first direction 350. In this example, the first resistor area 301b, the second resistor area 302b, the third resistor area 303b and the fourth resistor area 304b are outside of an area defined by the well-contact areas 335a, 335b and the sub-contact area 330.

Figure 5A:
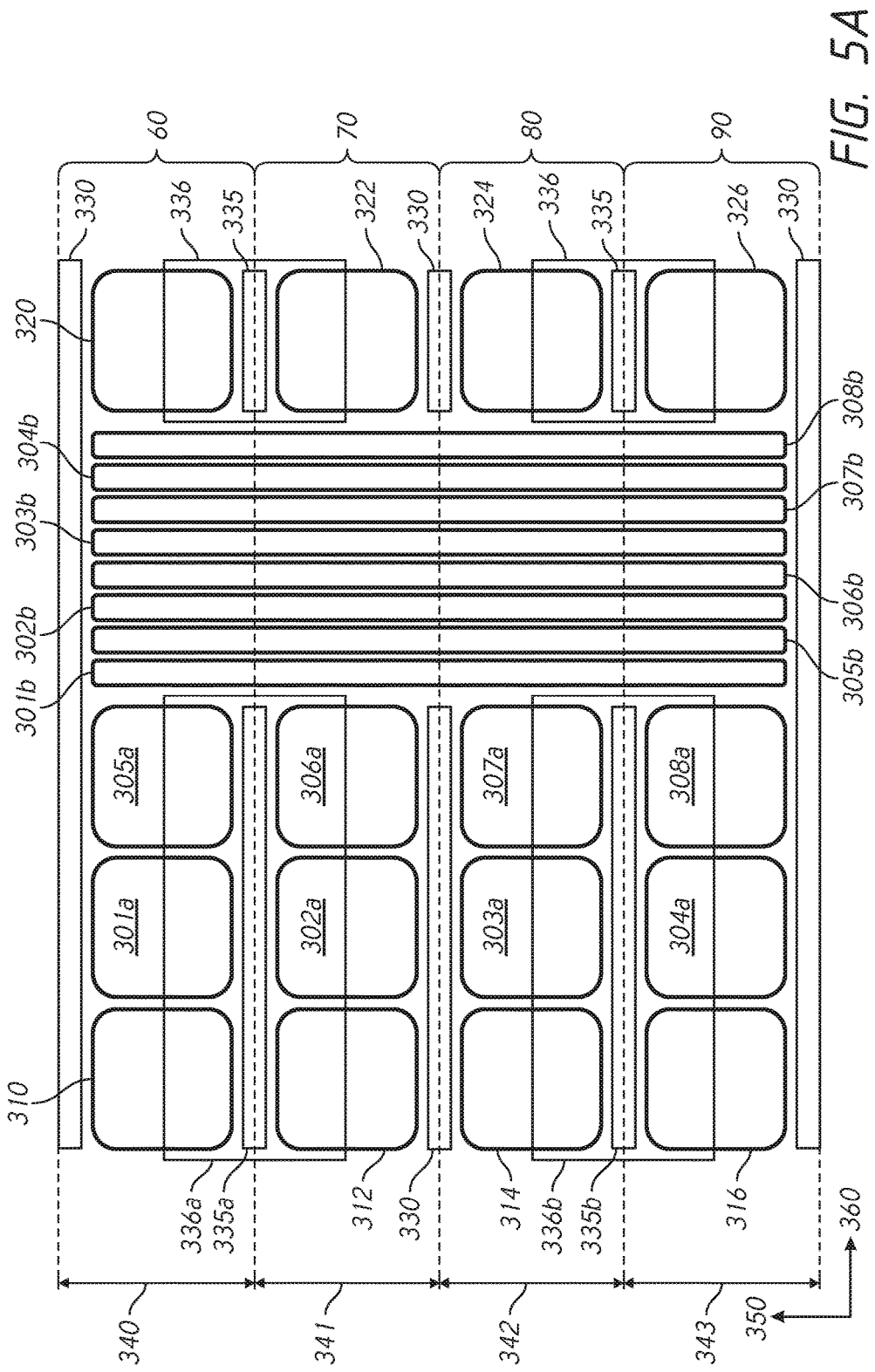
FIGS. 5A and 5B are simplified layout diagrams of logic circuits including circuit cells in accordance with an embodiment of the present disclosure.
Figure 5B:
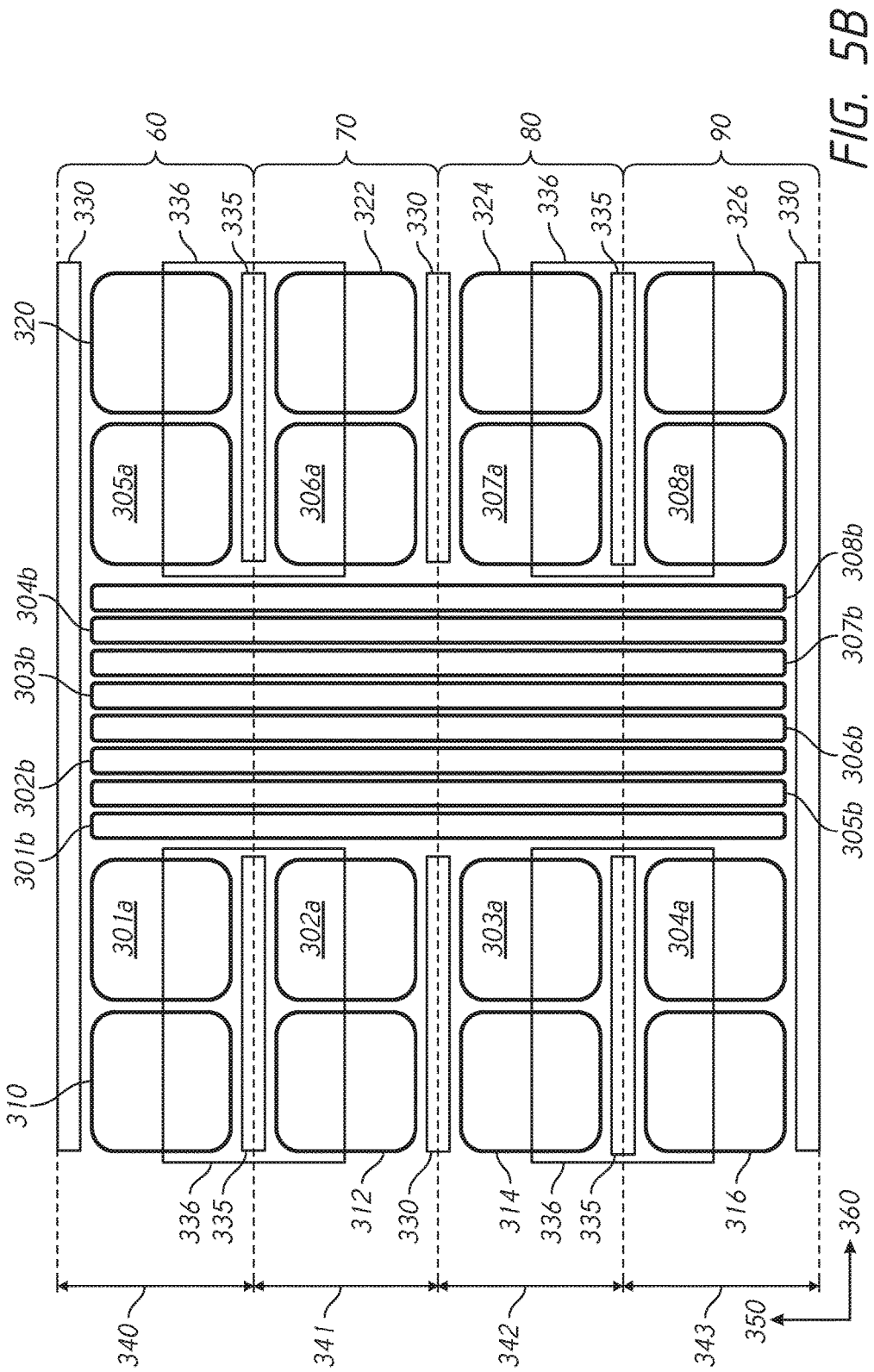

FIGS. 5A and 5B are simplified layout diagrams of logic circuits including circuit cells in accordance with an embodiment of the present disclosure. Description of components corresponding to components included in FIG. 4 will not be repeated. In FIG. 5A, transistor areas 301a and 305a and peripheral circuit blocks in circuit cells 310 and 320 are in the first layout region 60 and aligned to each other along the second direction 360. Transistor areas 302*a* and 306*a* and peripheral circuit blocks in circuit cells 312 and 322 are in the second layout region 70 and aligned to each other along the second direction 360. Transistor area 303*a* and 307*a* and peripheral circuit blocks in circuit cells 314 and 324 are in the third layout region 80 and aligned to each other along the second direction 360. Transistor area 304*a* and 308*a* and peripheral circuit blocks in circuit cells 316 and 326 are in the fourth layout region 90 and aligned to each other along the second direction 360. The transistor areas 301*a*, 302*a*, 303*a* and 304*a* are disposed along the first direction 350 across the well-contact areas 335*a*, 335*b* and the sub-contact area 330. The transistor areas 305*a*, 306*a*, 307*a* and 308*a* are also disposed along the first direction 350 across the well-contact areas 335*a*, 335*b* and the sub-contact area 330. Thus, sub-contact areas and well-contact areas may be shared by adjacent transistor areas of adjacent layout regions.

Each of eight delay circuits includes a logic circuit in its transistor area and a resistive element electrically coupled to the logic circuit. In this example, the first resistor area 301*b*, the fifth resistor area 305*b*, the second resistor area 302*b*, the sixth resistor area 306*b*, the third resistor area 303*b*, the seventh resistor area 307*b*, the fourth resistor area 304*b*, and the eighth resistor area 308*b* extend across the first layout region 60 to the fourth layout region 90 in the first direction 350. The first resistor area 301*b*, the fifth resistor area 305*b*, the second resistor area 302*b*, the sixth resistor area 306*b*, the third resistor area 303*b*, the seventh resistor area 307*b*, the fourth resistor area 304*b*, and the eighth resistor area 308*b* may be aligned between the sub-contact area 330 in the first layout region 60 and the sub-contact area 330 in the fourth layout region 90 along the second direction 360. For example, the first resistor area 301*b*, the fifth resistor area 305*b*, the second resistor area 302*b*, the sixth resistor area 306*b*, the third resistor area 303*b*, the seventh resistor area 307*b*, the fourth resistor area 304*b*, and the eighth resistor area 308*b* may be disposed outside of an area defined by the well-contact areas 335*a*, 335*b* and the sub-contact area 330. In FIG. 5A, the transistor areas 301*a* and 305*a* are adjacent to each other, the transistor areas 302*a* and 306*a* are adjacent to each other, the transistor area 303*a* and 307*a* are adjacent to each other, and the transistor area 304*a* and 308*a* are adjacent to each other. Alternatively, as shown in FIG. 5B, it is possible to have transistor areas in the same layout region across the resistor areas. For example, the transistor areas 301*a* and 305*a*, the transistor areas 302*a* and 306*a*, the transistor area 303*a* and 307, and the transistor area 304*a* and 308*a* are aligned along the second direction 360 in the layout region 60, 70, 80 and 90 respectively, across the first resistor area 301*b*, the fifth resistor area 305*b*, the second resistor area 302*b*, the sixth resistor area 306*b*, the third resistor area 303*b*, the seventh resistor area 307*b*, the fourth resistor area 304*b*, and the eighth resistor area 308*b*.

Channel types of transistors used in the embodiments described the above are merely examples. However, in other embodiments, combinations of the channel types of transistors other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a transistor area comprising at least one n-channel transistor and at least one p-channel transistor, the at least one n-channel transistor and the at least one p-channel transistor being disposed relative to each other in a first direction;
   a resistor area comprising at least one resistor, the resistor area being disposed relative to the transistor area in a second direction, the second direction crossing the first direction; and
   a delay circuit comprising a logic circuit and the at least one resistor coupled to the logic circuit, wherein the at least one resistor is disposed relative to the logic circuit in the second direction crossing the first direction;
   wherein the logic circuit is between the at least one n-channel transistor and the at least one p-channel transistor in the first direction, and wherein the at least one resistor extending in the first direction greater than a size of the logic circuit.

2. The apparatus of claim 1, wherein the at least one resistor is greater in length than a size of the transistor area in the second direction.

3. The apparatus of claim 1, further comprising a substrate-contact area and a well-contact area;
   wherein the transistor area is disposed between the substrate-contact area and the well-contact area.

4. The apparatus of claim 3, wherein one of the substrate-contact area and the well-contact area is elongated in the second direction to provide an elongated portion, the elongated portion being disposed relative to the resistor region in the first direction.

5. The apparatus of claim 4, wherein the third circuit and a fourth circuit are arranged in line in the first direction to form a third arrangement.

6. The apparatus of claim 1, further comprising an additional transistor area, the additional transistor area being disposed relative to the transistor area in the first direction and comprising at least one additional n-channel transistor and at least one additional p-channel transistor, and the at least one additional n-channel transistor and the at least one additional p-channel transistor being disposed relative to each other in a first direction.

7. The apparatus of claim 6, wherein the at least one resistor comprises a first portion and a second portion, the first portion being disposed relative to the transistor area in the second direction, and the second portion being disposed relative to the additional transistor area in the second direction.

8. The apparatus of claim 6, wherein the resistor area further comprises an additional resistor extending the first direction.

9. The apparatus of claim 8,
   wherein the at least one resistor is greater in length than a size of the transistor area in the second direction; and wherein the additional resistor is greater in length than a size of the additional transistor area in the second direction.

10. The apparatus of claim 6, further comprising a first substrate-contact, a well-contact area and a second substrate-contact area, the well-contact area being shared by the transistor area and the additional transistor area;
wherein the transistor area is disposed between the first substrate-contact area and the well-contact area; and
wherein the additional transistor area is disposed between the well-contact area and the second substrate-contact area.

11. The apparatus of claim 6, further comprising a first well-contact, a substrate-contact area and a second well-contact area, the substrate-contact area being shared by the transistor area and the additional transistor area;
wherein the transistor area is disposed between the first well-contact area and the substrate-contact area; and
wherein the additional transistor area is disposed between the substrate-contact area and the second well-contact area.

12. The apparatus of claim 1, wherein the first direction and the second direction are substantially perpendicular to each other.

13. An apparatus comprising:
a first substrate-contact area;
a first well-contact area disposed relative to the substrate-contact area in a first direction; and
a first delay circuit comprising a first logic circuit and a first resistor coupled to the first logic circuit;
wherein the first logic circuit is between the first substrate-contact area and the first well-contract area in the first direction;
wherein the first resistor is disposed relative to the first logic circuit in a second direction crossing the first direction; and
wherein the first resistor extending in the first direction greater than a size of the first logic circuit.

14. The apparatus of claim 13, further comprising:
a second substrate-contact area disposed relative to the first well-contact area in the first direction; and
a second delay circuit comprising a second logic circuit and a second resistor coupled to the second logic circuit;
wherein the second logic circuit is between the first well-contract area and the second substrate-contact area in the first direction;
wherein the second resistor is disposed relative to the first resistor in the second direction; and
wherein the second resistor extending in the first direction greater than a size of the second logic circuit.

15. The apparatus of claim 14,
wherein the first resistor extends across the first and second logic circuits; and
wherein the second resistor extends across the first and second logic circuits.

16. The apparatus of claim 14, further comprising:
a substrate region of a first conductivity type; and
a well region of a second conductivity type selectively formed in the substrate region to define first and second portions in the substrate region;
wherein the first and second substrate-areas are coupled to the first and second portions of the substrate region, respectively;
wherein the first well-contact area is coupled to the well region;
wherein the first logic circuit includes a first transistor formed in the first portion of the substrate region and a second transistor formed in the well region; and
wherein the second logic circuit includes a third transistor formed in the second portion of the substrate region and a fourth transistor formed in the well region.

17. The apparatus of claim 13, further comprising:
a second well-contact area disposed relative to the first substrate-contact area in the first direction; and
a second delay circuit comprising a second logic circuit and a second resistor coupled to the second logic circuit;
wherein the second logic circuit is between the first substrate-contract area and the second well-contact area in the first direction;
wherein the second resistor is disposed relative to the first resistor in the second direction; and
wherein the second resistor extending in the first direction greater than a size of the second logic circuit.

18. The apparatus of claim 17,
wherein the first resistor extends across the first and second logic circuits; and
wherein the second resistor extends across the first and second logic circuits.

19. The apparatus of claim 17, further comprising:
a substrate region of a first conductivity type; and
first and second well regions selectively formed in the substrate region to define a portion of the substrate region therebetween;
wherein the first substrate-area is coupled to the portion of the substrate region;
wherein the first and second well-contact areas are coupled to the first and second well regions, respectively;
wherein the first logic circuit includes a first transistor formed in the portion of the substrate region and a second transistor formed in the first well region; and
wherein the second logic circuit includes a third transistor formed in the portion of the substrate region and a fourth transistor formed in the second well region.

* * * * *